United States Patent
Froese-Peeck et al.

[11] Patent Number: 6,039,254
[45] Date of Patent: *Mar. 21, 2000

[54] METHOD FOR IMAGING BAR CODES

[75] Inventors: Rüdiger Froese-Peeck; Detlef Gerhard; Johann Lechner, all of München, Germany

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/507,284
[22] PCT Filed: Mar. 14, 1994
[86] PCT No.: PCT/DE94/00278
   § 371 Date: Aug. 30, 1995
   § 102(e) Date: Aug. 30, 1995
[87] PCT Pub. No.: WO94/22104
   PCT Pub. Date: Sep. 29, 1994

[30] Foreign Application Priority Data

Mar. 18, 1993 [DE] Germany ............... 43 08 699

[51] Int. Cl.⁷ .................................................. G06K 7/10
[52] U.S. Cl. ............................. 235/462.32; 235/470
[58] Field of Search .................... 235/462, 472, 235/462.32, 462.33, 470

[56] References Cited

U.S. PATENT DOCUMENTS

| | | |
|---|---|---|
| 3,662,181 | 5/1972 | Hercher et al. . |
| 3,737,629 | 6/1973 | See . |
| 4,210,802 | 7/1980 | Sakai .......................... 235/462 |
| 4,585,931 | 4/1986 | Duncan et al. . |
| 4,794,238 | 12/1988 | Hampton ................... 235/462 |
| 4,806,776 | 2/1989 | Kley . |
| 4,811,410 | 3/1989 | Amir et al. . |
| 4,818,886 | 4/1989 | Drucker ..................... 235/472 |
| 4,896,034 | 1/1990 | Kiriseko .................... 250/271 |
| 5,298,727 | 3/1994 | Spratte et al. ............. 235/462 |
| 5,515,452 | 5/1996 | Penkethman et al. ...... 382/141 |
| 5,545,886 | 8/1996 | Metlitsky et al. .......... 235/462 |

FOREIGN PATENT DOCUMENTS

| | | |
|---|---|---|
| 61000 | 9/1982 | European Pat. Off. ............. 235/462 |
| 2 594 982 | 8/1987 | France . |
| 2 652 914 | 4/1991 | France . |
| 27 04 983 C3 | 8/1978 | Germany . |
| 41 14 925 | 1/1992 | Germany . |
| 59-86557 | 11/1985 | Japan ......................... 235/462 |
| 61-54570 | 3/1986 | Japan ......................... 235/462 |
| 61-221882 | 10/1986 | Japan ......................... 235/462 |
| WO 86/03605 | 6/1986 | WIPO . |

OTHER PUBLICATIONS

"Technische Optik [Technical Optics]; Prof. Gottfried Schröder; Vogel Buchverlag Würzburg; p. 152".

*Primary Examiner*—Donald Hajec
*Assistant Examiner*—Mark Tremblay
*Attorney, Agent, or Firm*—Hill & Simpson

[57] ABSTRACT

The method is for use in a bar code reader. By means of a special illumination of the bar code applied to a reflecting surface/wafer and special receiver optics, bright-field illumination is implemented. Optimum contrasts between the images of the marking elements and the surrounding reflecting areas offer a high recognition reliability.

14 Claims, 7 Drawing Sheets

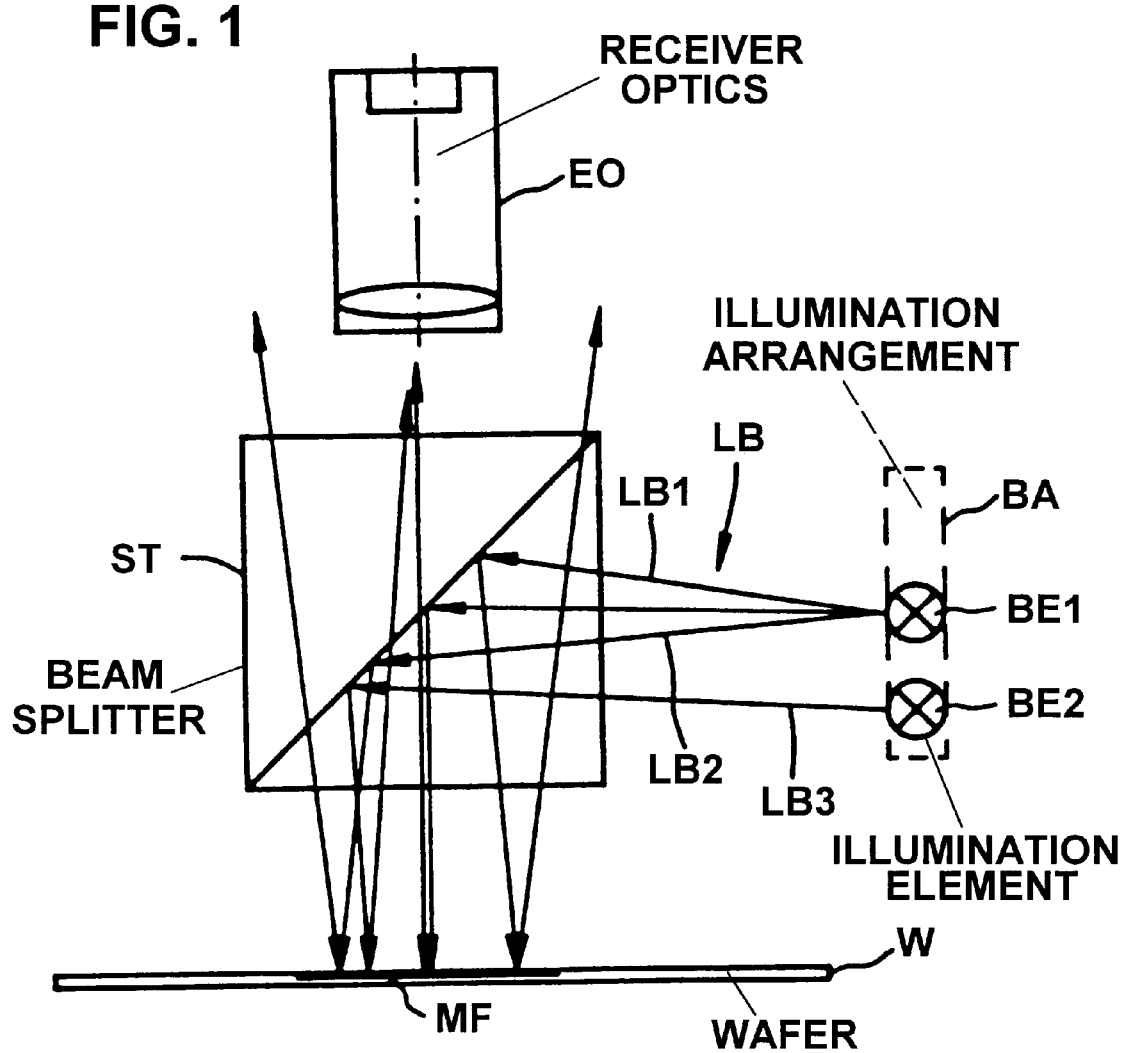

METHOD FOR IMAGING BAR CODES

BACKGROUND OF THE INVENTION

The invention relates to a method for illuminating flat bar codes, an image of the bar code being generated on a receiving sensor via receiver optics for the recognition and evaluation of the bar code. The illumination and the receiving sensor are matched to the usually longitudinally extended flat form of a bar code. The method is suitable for use in a bar code reader.

In semiconductor production, semiconductor structures (electronic components; chips) are constructed on silicon wafers, using different chemical and physical processes. During the entire chip production, the wafers must always be able to be assigned unequivocally to a production order. Only in this way can the next process step for the wafers be determined reliably and the process data arising can be stored. For the unequivocal identification of various wafers, a marking is applied to the latter. For marking, laser methods can be used in an advantageous way. Here, either a so-called clear text and/or a bar code marking is applied to a wafer. Because of the multiplicity of successive process steps, in which material coatings, etching sequences or the like are carried out on the wafer, the marking is affected detrimentally. The marking quality decreases on average with the number of production steps.

If the guiding of the process is to be supported by the use of automatic identification devices, even markings of poor quality must be able to be identified reliably.

The identification of wafers proves to be very difficult, because of the disturbing variables present and the treatment processes to be carried out, which affect the markings detrimentally. The identification is therefore often carried out by humans. In individual cases, intelligent image processing systems or scanners especially adapted to this problem are also used for bar code recognition. Disturbing variables occurring such as, for example, inaccurate wafer feeding, tilting of the wafer and streaks on the marking or contrasts which are too low within the bar code lead to a reduced operational reliability of the identification systems. The recognition of the marking with the human eye is cost-intensive and time-intensive. The use of image processing systems is likewise costly and not sufficiently reliable. The recognition times, as a rule, are over one second.

In German Patent Specification DE 27 04 983 C3, a device is described with which the whole field of view, for example the field of the marking area of a bar code, is imaged onto the effective area of a row of photodiodes used as receiving sensor. However, the device is used for the recognition of faults in the surface or in the dimensions of an object.

SUMMARY OF THE INVENTION

The invention is based on the object of achieving optimal contrasts within the image, produced on a receiving sensor, of a bar code applied to a reflecting surface, in order to detect unequivocally the position of marking elements within the bar code. This object is achieved by a method for imaging bar codes, the stationary bar code being illuminated by means of an illumination device and receiving optics imaging the area having the bar code completely in its longitudinal direction, here lying in the x-direction, and at least partially with reference to the height of the marking elements, which run in the y-direction, onto a one- or two-dimensionally spatially resolving receiver. Bundles of light from the illumination device are incident on the area having the bar code in such a way that the reflected bundles of light generate, via receiving optics, a maximum illumination intensity on the receiving sensor, and thus bright-field illumination with respect to the areas surrounding the marking elements. A line of light generated on the illumination device is oriented in such a way that bundles of light which proceed from the beginning to the end of the line of light, seen in the longitudinal direction, are incident on area elements from the beginning to the end of the area having the bar code under bright-field illumination. Thus the bundles of light reflected from the areas surrounding the marking elements get into the receiving sensor via the receiver optics. The line of light is moved transversely to its longitudinal extent and transversely to the bundles of light considered, until the bright-field illumination is present and until the bundles of light are incident on the bar code and get into the receiving sensor via the receiving optics under bright-field illumination. The height of the line of light is designed in such a way that light components of light scattered on the bar code, which have their origin in the edge regions of the line of light and get into the receiving optics, are minimized.

The invention is based on the knowledge that, in the imaging of a bar code applied to a reflecting surface onto an at least one-dimensionally resolving receiving sensor, for example a row of photodiodes, an image as contrast-rich as possible must be generated. In this respect, the illumination of the bar code must be arranged in such a way that the light is reflected from the reflecting surface into the receiving optics, so that bright-field illumination is produced. In the image of the bar code on the row of photodiodes, the marking elements, the lines, can thus be recognized as dark regions and the interspaces as light regions. Dark-field illumination can be generated in the same way. In this case, in the image of the bar code on the row of photodiodes, a marking element, a line, will thus appear as a bright region and an interspace between the marking elements as a dark region. The setting of the bright-field illumination or the dark-field illumination, respectively, for reflecting objects, in combination with a longitudinally extended bar code, requires the use of a line of light, whose position must be capable of alteration or setting. It is to be ensured that light beams from each part of the marking area of the bar code get into the receiver optics. Contrasts on a reflecting surface come about due to the different roughnesses. The marking area of a bar code has marking elements and interspaces and surrounding marking areas, respectively. In this case, the marking elements have been applied actively, for example via a laser method, and their surface is rougher. The roughnesses effect a scattering of the light reflected from the marking elements.

The incident illumination to be used here can be differentiated into bright-field or dark-field illumination by definition, in accordance with "Technische Optik [Technical Optics]; Prof. Gottfried Schröder; Vogel Buchverlag Würzburg; page 152". Bright-field illumination is present when the opaque object is illuminated from above and a fault-free area offers a uniformly bright field of view for the receiver of the reflected stream of light. Dark-field illumination is present when illuminating bundles, after reflection at the surface of the object, are not incident on the receiver. In the case of a fault-free surface, a uniformly dark field of view would result in this case.

The invention is based on the knowledge that bright-field or dark-field illumination as contrast-rich as possible must be achieved. The basis for the considerations is the rule that the angle of incidence is equal to the angle of emergence.

For the respectively set type of illumination, it is, then, valid to set the optimum illumination intensity with an optimum contrast at the receiving sensor. In the event that the surface of the object does not correspond to an ideal reflector, but that rather the incident light is scattered by roughnesses, the light distribution of the reflected light is broadened. Not every bundle of light which is reflected is incident on the receiver optics. In the present invention, a line of light is moved in such a way that the condition—angle of incidence=angle of emergence—is fulfilled. In addition, the thickness of the line of light transversely to its longitudinal extent is to be designed in such a way that light components of light scattered on the bar code, which have their origin in the edge regions of the line of light and get into the receiver optics, are minimized.

An advantageous refinement of the invention envisages that, for the generation of a line of light, the light emitted by light-emitting diodes of the illumination device is homogenized at an exit surface and part of this light represents a line of light via a slit diaphragm connected downstream. As described above, the slit diaphragm is movable, in order to achieve bright-field illumination or dark-field illumination, respectively, at a specific position.

The construction of a discrete line of light, which can be moved in the z-direction, can likewise be achieved by means of an illumination device having a plurality of light guides lying on top of one another.

By means of the use of special optics, the height of the markings of a bar code can be made smaller or integrated. The illuminated and imaged height of a marking element or of all marking elements, respectively, is compressed by the optics in one direction, specifically in the z-direction, so the image on the position-sensitive receiver is constructed in such a way that the field of view or the illuminated region, respectively, of the bar code is imaged completely with a view to a complete resolution. A resolution between the marking elements and the marking areas surrounding the latter within the bar code is carried out in the form that at least two to three elements of the sensor are available for one possible place of a marking element or of the image of the marking element on the sensor, respectively.

Further advantageous refinements of the invention are as follows.

An alternative method for imaging bar codes, has the following steps: Bundles of light from the illumination device are incident on the area having the bar code in such a way that the reflected bundles of light generate, via the receiving optics, a maximum illumination intensity on a receiving sensor, and thus dark-field illumination with respect to areas surrounding the marking elements. A line of light generated by the illumination device is oriented such that bundles of light which proceed from a beginning to an end of the line of light, seen in a longitudinal direction of the line of light, are incident on the elements from a beginning to an end of the area having the bar code under dark-field illumination. The bundles of light reflected from the areas surrounding the marking elements do not enter into the receiving sensor. The line of light is moved transversely to its longitudinal extent and transversely to the bundles of light considered, until the dark-field illumination is present. The height of the line of light is structured such that light components of light scattered by the bar code, which have an origin in edge regions of the line of light and enter into the receiving optics, are minimized.

The generation of a movable line of light is carried out by using a slit diaphragm which is connected downstream of a light source, light incident on the slit diaphragm being homogenized.

The generation of a movable line of light is carried out by using a plurality of light guides lying on top of one another, each of which is individually charged with light and whose light exit face on an end thereof represents a plurality of lines of light on top of one another, each of which emits homogeneous light.

The receiving optics image the length and height, respectively, of the bar code with a different imaging scale, so that the length of the bar code is imaged completely in the image on the receiving sensor and the height of the bar code is imaged at least partially in the image on the receiving sensor.

Illumination intensity incident on the receiver sensor is controlled to optimize contrast, a control adjusting the setting of position of the movable line of light and intensity of the light in the illumination device accordingly.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 1 represents the relationships in the processing of reflecting surfaces.

DESCRIPTION OF THE PREFERRED EMBODIMENTS

The method relevant to the invention solves the following problems:
recognition of bar codes on reflecting surfaces,
resolution or recognition in spite of poor contrast between reflector and scattering surface,
the influence of disturbing variables such as, for example, tilting, streak formation, scratches, different roughnesses on the surface is reduced.

The entire method uses a special bright-field illumination for imaging the marking area MF in an optics unit. The marking elements ME on the marking area MF scatter the light incident upon them for the most part past the receiver optics EO. The element appears dark.

The system of receiver optics EO and receiver sensor ES or sensor field images the marking in such a way that the various axes of the imaging planes have different optical scales. The system is designed in such a way that the smallest surface elements along one axis on the sensor are integrated. The receiver optics EO, in so doing, in particular images the height of the lines of a bar code in such a way that they appear in the image compressed in terms of height. This effects an integration of the brightness over the bar height. For this reason, small faults in the contrast, for example the lack of a part of a marking or a scratch in the white interspace, which appears black, stand out less strongly. This leads, as a whole, to a reduction of the disturbing effects of the stochastically occurring disturbing variables such as scratches or streaks. In addition, inhomogeneities of the marking elements are compensated for.

Disturbances such as tilting of the wafer or different roughnesses of the surface are reduced by means of an adjustment of the illumination unit, and the contrast is reinforced.

The illumination arrangement BA shown in FIG. 1, special because of the planar and reflecting surface, is used to let light beams from each part of the spatially extended marking area MF get into the receiver optics EO. From each illumination element BE, BE1-2, only a narrow bundle of light LB gets, via the semi-transparent beam-splitter ST, onto the wafer W having the marking area MF and is reflected from here into the receiver optics EO. The bundles of light LB1 and LB2 of the illumination element BE1 do not get into the receiver optics EO. Using many illumination elements of this type, arranged correctly, the spatially extended marking area MF can be illuminated uniformly in the bright-field process.

Figure 2A:
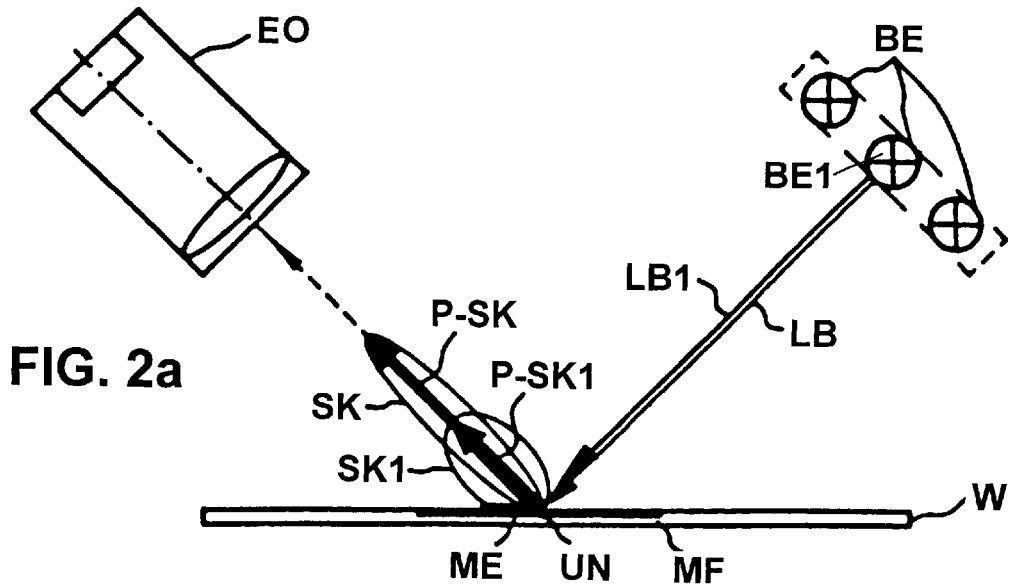
FIG. 2a represents the optical relationships with respect to the contrast between marking elements and surrounding marking areas.

In a usual illumination arrangement BA, many illumination elements BE lie alongside each other, as shown in FIG. 2a. The bundle of light LB from the illumination element BE1 is incident upon the surrounding marking area UM of the wafer W and is reflected into the receiver optics EO. Since the surrounding marking area UM does not represent an ideally reflecting surface, the reflected light forms a narrow scattering cone SK. The light beams with the greatest intensity get into the receiver optics and are represented as arrow P-SK. A bundle of light LB1 is incident on a marking element ME alongside the bundle of light LB and is also reflected into the receiver optics EO. Since the marking element ME has a higher roughness than the surrounding marking area UM, a broader scattering cone SK1 is formed. The arrow P-SK1 represents the largest intensity of this scattering cone by means of its corresponding length. The reflected light of the bundle of light LB1 also gets into the receiver optics EO. The length difference of the arrows P-SK and P-SK1 reproduces the contrast between the surrounding marking area UM and the marking element ME.

Figure 2B:
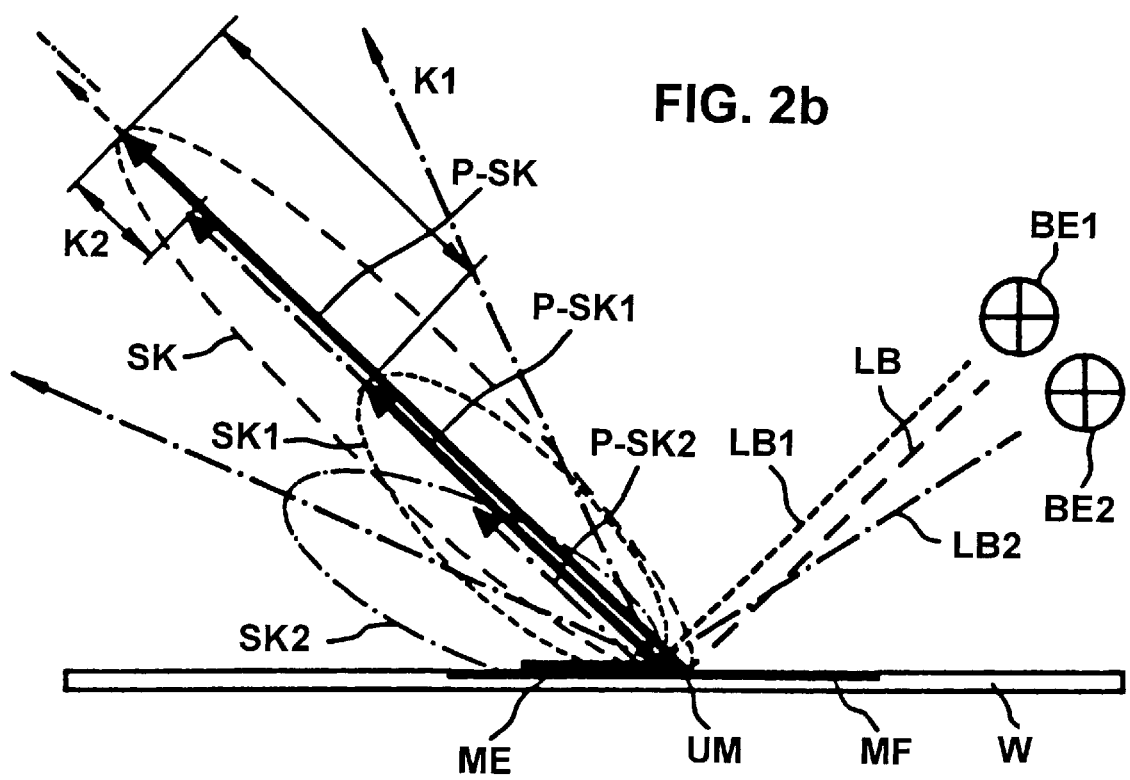
FIG. 2b explains the contrast reduction caused by bundles of light from adjacent illumination elements.

In addition, in FIG. 2b, the illumination with the illumination element BE2 is shown. The bundle of light LB2 is intended to be incident on the same area of the marking element ME as the bundle of light LB1. Because of the roughness of the marking element ME, a scattering cone SK2 is formed. A large part of the reflected light does not get into the receiver optics EO. However, part of the reflected light, which is represented by the arrow P-SK2, has the same direction as the light which is represented by the arrows P-SK and P-SK1, and also gets into the receiver optics EO.

Because of the overlapping of the reflected light beams of the bundles of light LB, LB1, LB2, there is produced in the receiver optics EO an image of the wafer W having the lowest contrast K2. The illumination arrangement is to be set in such a way that only light from the illumination element BE1 is incident on the relevant wafer surface and hence the optimum contrast K1 appears in the receiver optics.

The plane of the marking area MF can be tilted. Likewise, because of tolerances in the feeding of the wafer, a tilting of the wafer W can arise. For the case that the wafer W is positioned in its desired position, only the illumination element BE1 of the illumination arrangement BA is switched on, corresponding to the above-described conditions. Using the diaphragm BL, it is illustrated that only a narrow bundle of light LB1 is incident via the beam-splitter ST on the wafer W. The reflected light generates a contrast-rich image in the receiver optics EO in the case of bright-field illumination.

If the marking area MF is tilted at an angle a, an illumination element BE2, the bundle of light LB2 of which fulfills the bright-field conditions, must be switched on in order to generate a contrast-rich image.

Figure 4:
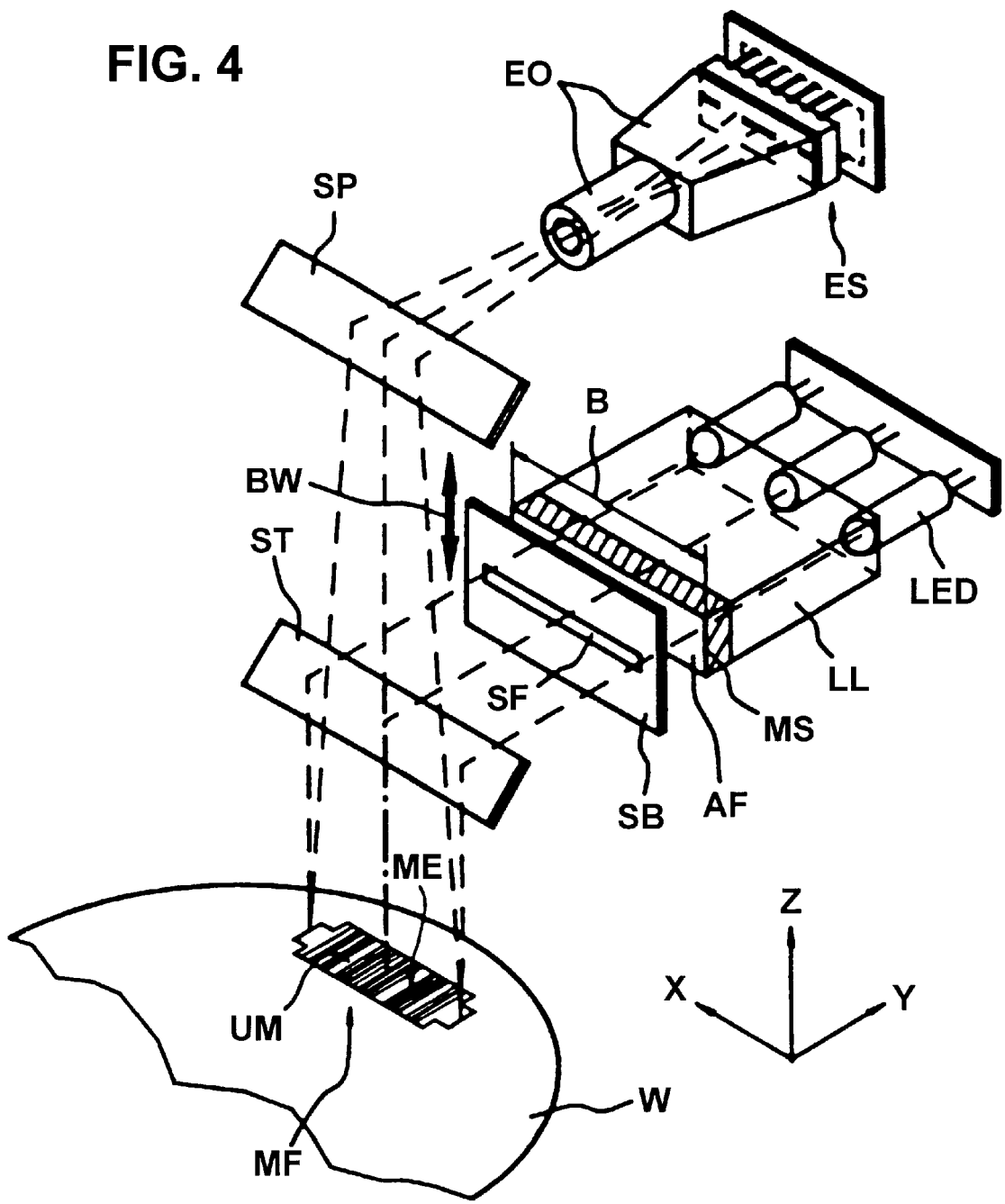
FIG. 4 represents a complete arrangement of the individual components for imaging a bar code.

FIG. 4 shows the implementation of an arrangement for illuminating a bar code on a reflecting surface. The illumination device contains light-emitting diodes LED, which are coupled to a light guide LL. The light emerging at the exit face AF of the light guide or of an intermediately connected ground glass disk MS is homogeneous to the greatest possible extent. This is achieved by the fact that the light radiated by the light-emitting diodes LED into the light guide LL is reflected many times at the outer faces of the light guide LL, by which means the homogenization of the light is brought about. If it is still necessary, a homogenization of the light over the exit face can additionally be achieved with a ground glass disk MS connected downstream.

The width B of the light exit face AF is chosen in such a way that the described conditions for taking into account the reflecting surface corresponding to FIG. 1 are fulfilled. The width B is increased by a corresponding amount to be able further to fulfill the described condition in the event of a tilting of the wafer surface about the y-axis. Beginning and end regions of a bar code applied to the wafer are then always homogeneously illuminated. In the representation corresponding to FIG. 4, the light is first guided onto the wafer W having the marking area MF, is reflected there and is guided via the stationary reflector SP into the receiver optics EO. The entire arrangement takes into account the rectangular form, as a rule longitudinally extended, of the bar code. The image of the marking area MF imaged via the receiver optics EO on the receiving sensor ES is matched, with reference to the extension in the x-direction, to the elements of the receiving sensor ES resolving spatially in this direction. If a one-dimensionally resolving receiving sensor ES is present, an integrated or longitudinally compressed or compressed image of a corresponding section of the marking area is generated for each of its elements. By means of this integrating effect, the influence of specific disturbing variables, such as for example scratches or streaks, is reduced. A two-dimensionally spatially resolving receiver (CCD array) can likewise be used.

In order to fulfill the conditions for an optimum contrast corresponding to FIGS. 2a and 2b, a narrow slit diaphragm SB was arranged. By means of the movement BW of the slit diaphragm SB in the direction of the z-axis, a diaphragm position can be found in which the bright-field condition can be fulfilled. The longitudinal extent of the slit area SF in the slit diaphragm is designed corresponding to the necessity to illuminate the marking area MF sufficiently in each condition. By means of the minimization of the diaphragm opening transversely to its longitudinal extent, following the subject-matter of claim 1, an optimum contrast can be achieved at the receiving sensor ES.

Figure 5:
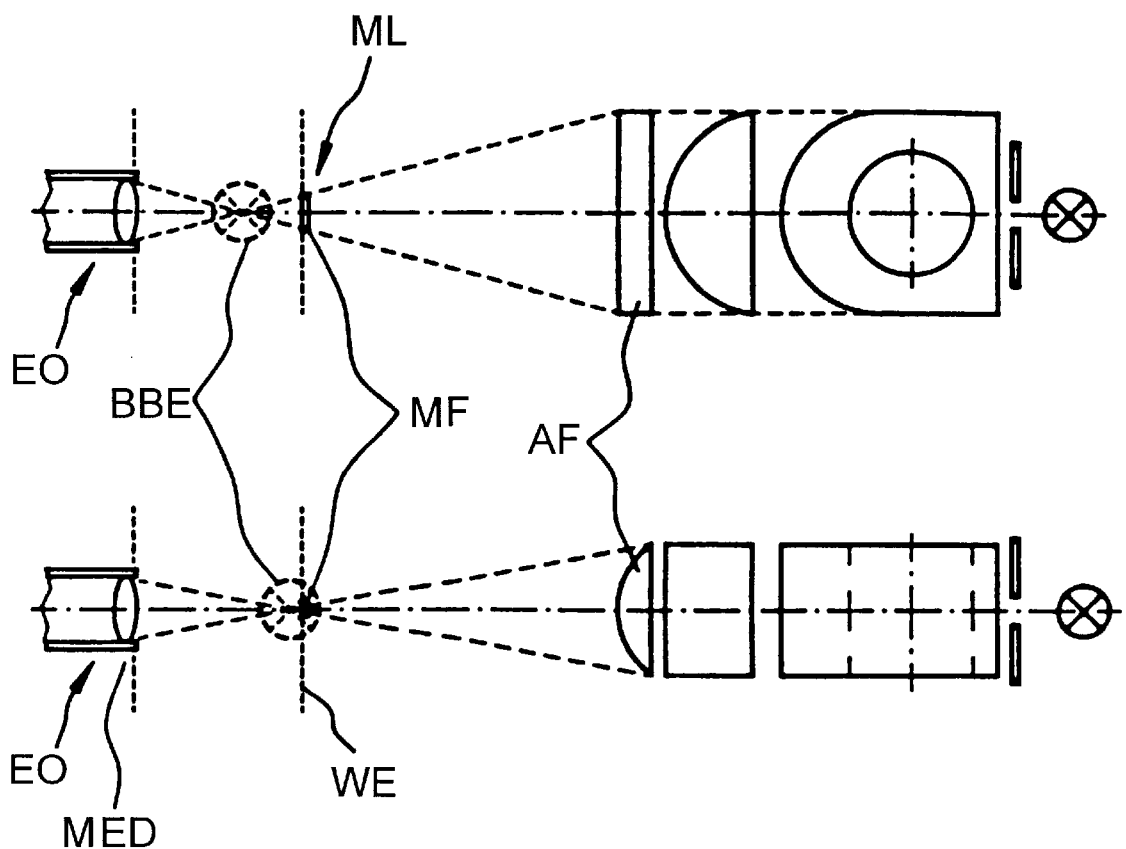
FIG. 5 relates to an arrangement which generates an illumination with directed light by means of a lens system.

Instead of a light guide for homogenizing the light, a uniform illumination of the marking area can also be achieved with a special lens system corresponding to FIG. 5 having directed light. Initially, the light is expanded using a hole in a first lens element. Further cylindrical lenses focus the light in a directed way in such a manner that the marking area MF is illuminated homogeneously. The reflected light then gets into the receiver optics EO. In FIG. 5, the beam path is shown as a straight line, for better understanding. In the use of the method, the light is reflected in the plane of the wafer W. Because of the simple cylindrical lenses used here, the image of the illumination element along the optical axis is longitudinally distorted, by which means a still sufficiently homogeneous illumination is given in the event of changes in the spacing of the wafer.

By means of the dimensioning of the width and the height of the illumination lenses, the rectangular area of the marking area MF having the bar code can be completely illuminated (FIG. 5). Using this dimensioning, the requirements on the method to treat a reflecting surface and, respectively, simultaneously to take into account a tilting of the wafer W about the y-axis, corresponding to FIG. 4, can also be achieved. A movable slit diaphragm SB can also be arranged in the region of the exit face AF, as in FIG. 4. In order to achieve a good contrast, the principle of FIGS. 2a and 2b is to be used in any case.

Spherical lenses in combination with cylindrical lenses are used as imaging optics. Focal length and arrangement are chosen in such a way that different imaging scales result in the x- and in the z-direction. Optics of this type are used in particular because the height of the bar code is intended to be imaged reduced to the height of the photodiode elements. An integration is achieved hereby. Streaks or scratches on the bar code thereby just have a small influence on the respective brightness in the image or on the voltage level of the electrical signal of the line of photodiodes in the receiving sensor ES. The marking elements are normally applied by means of a laser. These, mostly point-shaped, depressions have more or less large separations from each other. Here too the integration effect of these imaging optics has a favorable effect on the image or on the electrical signal, respectively.

The aim of imaging the height of the bar code in an integrating manner onto the row of photodiodes can also be achieved without anamorphotic imaging optics, using a special row of photodiodes. The bar code is imaged, using normal spherical optics, onto a special row of photodiodes having extremely high photodiode elements.

For automation, the entire system is controlled. As already described, the wafer identification is subject to widely varying disturbing variables. The latter can be subdivided into a length change of the marking area MF with respect to the defined desired position and the change of roughness between the marking areas MF of different wafers. The disturbing variables effect a worsening of the contrast. An identification of the marking can become impossible. With the help of the adjustment, the influence of these disturbing variables is reduced.

Figure 6:
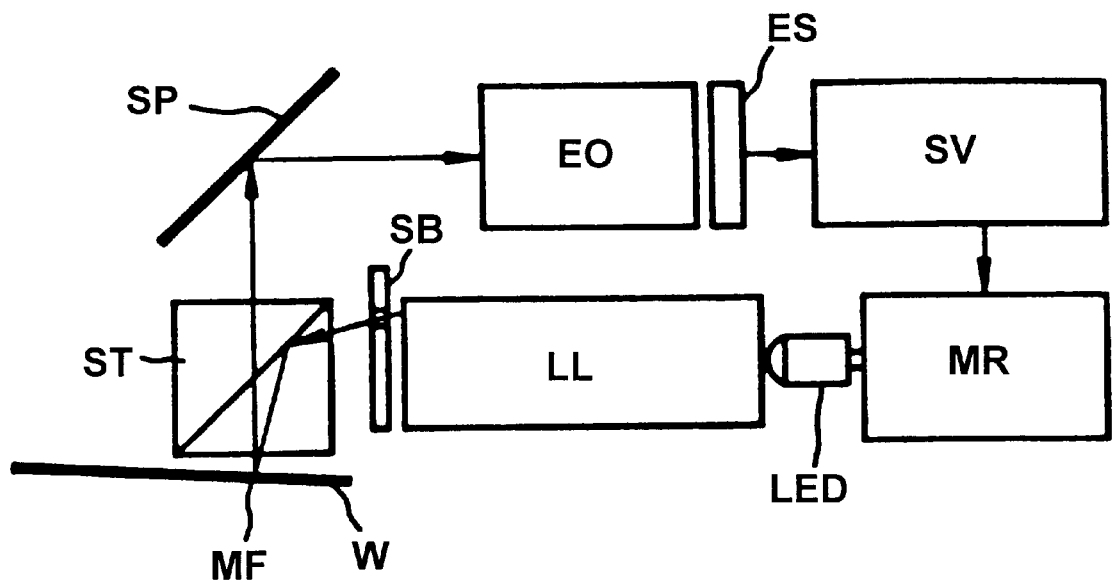
FIG. 6 is a representation in principle of the entire arrangement, wherein the bar code on a tilted wafer is to be read.

FIG. 6 shows the entire arrangement for carrying out a method according to the invention. The control uses the following control variables:

a) maximum brightness or average total brightness S(h) and b) maximum or average useful signal brightness S(n).

These control variables are transformed, via an electrical conditioning of the signal made available by the receiver sensor ES, into electrical signals S(h) and S(n), respectively, to be assigned unequivocally to the control variables.

The manipulated variables made available by the control effect a change of the brightness emitted at the exit face AF and a change of the position of the slit diaphragm SB.

A position change of the marking area can be produced by tilting of the wafer W with respect to a desired position or by warping of the wafer surface. Limits for rotations of the marking area MF about the z-axis are preset by the height of the bar code, for rotations about the y-axis by the width of the slit area SF transversely to its longitudinal extent and the illuminating exit face AF (FIG. 4).

A tilting of the marking area MF about the x-axis and a variation of the marking area position in the z-direction (i.e. a modification of the distance from this surface to the receiving optics (EO) with the receiving sensor (ES). effect a change of the reflection angle necessary for the bright-field imaging. The marking is no longer optimally illuminated and is imaged via the receiver optics with poor contrast. A matching of the illumination is achieved by using the position correction of the slit diaphragm SB. The slit diaphragm SB is displaced in the z-direction by means of an adjustment in such a way that a maximum light entry into the receiver sensor or into the receiver sensor field is produced. The measured electrical signal S(h) is controlled to a maximum via the position of the slit diaphragm SB. If, during this control process, too much light falls onto the receiver sensor ES, then the intensity of the light emerging at the exit face AF is adjusted.

Figure 3:
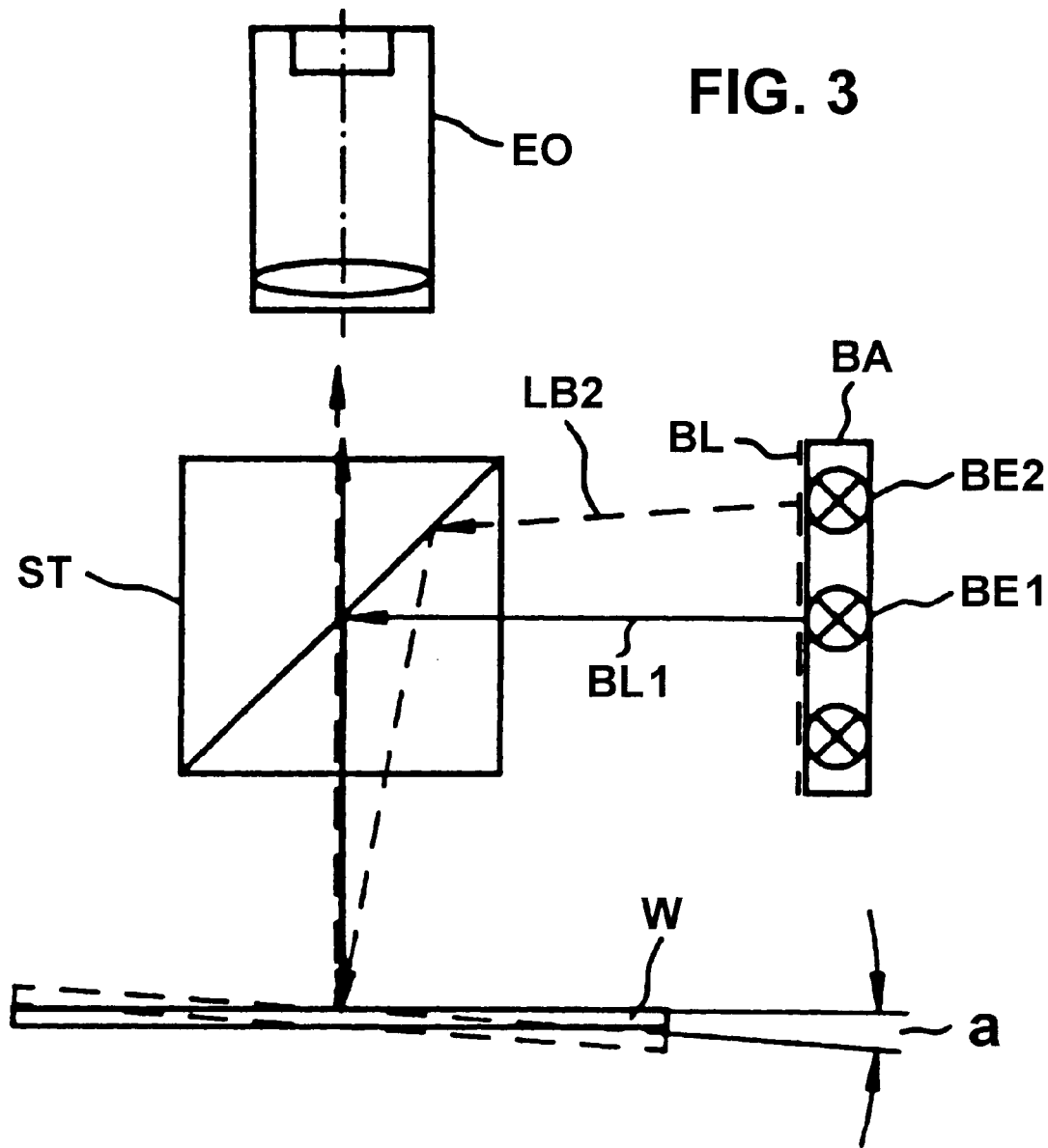
FIG. 3 relates to the treatment of tilted wafers.

In a variation of the position of the marking surfaces in z-direction (FIG. 4) (i.e. in a modification of the distance from this surface to the receiving optics (EO) with the receiving sensor (ES)) the utilization of a beam splitter (FIGS. 1, 3, and 4) offers the advantage that the optical axis of the receiving optics (EO) with the receiving sensor (ES) can be arranged at 90° relative to the surface with the bar coding. The advantage is that the image of the bar coding incident on the receiving sensor (ES) does not shift (depending on tilt) in a modification of the distance from the surface with the bar code to the receiving optics (EO) with the receiving sensor (ES), and thus a simple and rapid evaluation is possible. Given a shifting of the image on the receiving sensor, the search for the position of the image to be evaluated would also be necessary.

The contrast on the wafer surface is brought about by means of different roughnesses between marking elements ME and marking area UM surrounding the latter or lying around the latter. The roughnesses effect a scattering of the light reflected by the marking area MF. The roughnesses of the markings offered to the reading head are not always the same. The quantity of light incident on the receiver sensor ES is a function of the marking quality. Using the control, the brightness onto the exit face AF is set in such a way that the electrical useful signal level S(n) corresponding to the control variable is a maximum.

In FIG. 5, apart from the illumination with diaphragm and the correspondingly matched optics having a specific exit face AF, there are further illustrated the receiver optics EO, the wafer plane WE, the marking area MF and the location at which homogeneous light HL is present. The main plane of the imaging optics is designated by HEO. The image of the illumination element is identified by BBE.

In FIG. 6, in addition to the elements previously described, a signal processing unit SV is illustrated, as is a brightness control HR.

The definition of a bright-field illumination is, in particular:

The light of the illumination is reflected on the object surface (angle of incidence=angle of emergence). The reflected light gets directly into the receiver optics EO. In the event that the object surface does not correspond to an ideal reflector, but that rather the incident light is scattered because of roughness, the bundle of light is expanded, and the entire irradiating light is no longer incident on the receiver optics EO.

As a marking area, consideration is given in particular to an area section on the wafer or on a reflecting surface, respectively, on which a change of roughness of the area has been brought about in places, using a specific method (laser marking).

A marking element ME is an area section, whose position is predetermined, in the marking area MF. The roughening can be carried out by a laser method. Small holes are here melted into the surface or burned into the surface. The marking points melted in by the laser are not always located flush alongside each other. Unchanged surface elements can also be located between the individual marking points.

By useful signal brightness, that signal is understood which is generated by imaging the bar code in the receiver sensor or receiver sensor field, respectively, corresponding to the course of the bar code. Brightness changes are expressed as electrical signal level changes.

The average level change measured over one scanning period is the average useful signal brightness. The maximum electrical level change measured over one scanning interval is the average level change. The unequivocal electrical signal S(n) is assigned to the measured useful signal brightness.

The elements of bar codes (depressions) effect a beam deflection. Depending on the depth of the bar code introduced into the wafer W, deflection angles of, on average, 1° or greater can occur. The diaphragm aperture of the movable slit diaphragm SB is matched to an angle which is a minimum in this respect, so that the majority of the light beams reflected from a bar code are not incident on the imaging optics. The element of the bar code is imaged onto the receiving sensor ES as dark. The brightness of the light-emitting diodes LED can subsequently be adjusted in such a way that a maximum contrast is produced.

For producing a light guide LL constructed in layers for the generation of a line of light, for example, normal glass or plexiglass or another common light-guide material can be used. Not only the adjustment for achieving an optimum contrast, but also the up and down movement of the slit diaphragm SB can be automated. Homogenized light must be incident on the area of the diaphragm. The diaphragm cuts out a specific part therefrom. The total of three variants for generating a line of light or for generating homogenized light directed onto the marking area MF are each capable of implementation per se.

The fundamental idea of the invention consists in detecting and evaluating a severely restricted angular range of the light incident on the wafer. In order to recognize so-called soft marks (depressions with a depth of about 0.5 $\mu$m) with sufficient contrast with respect to their surroundings, the conditions described are necessary. The condition for a line of light consists in the fact that the narrower the line of light (seen in the z-direction), the sharper is the contrast. With increasing roughness of the surface, the distribution of the reflected light (scattering lobe) becomes broader and the contrast in relation to the surrounding marking area UM, which reflects like a mirror to the greatest possible extent, becomes larger.

A bar code marking, for example a bar code, has the following data:

Line height: 1.7 mm with a total of 18 marking points (dots).

A marking field MF has the areal extent of about 16•1.7 mm.

By means of the invention, even bar codes which have been generated with hard marks can be read. Hard marks are marking points from which the bars of a bar code have been produced, deeper holes being present in each case.

As described at the beginning, the problems in the identification of wafers whose reflecting surface is provided with a bar coding, especially a bar code, consist firstly in the fact that a sufficiently contrast-rich image must be generated on a receiver. To compound matters, the application of the markings within a bar code can latterly be carried out with so-called soft marks, which have a very low depth. Hence, a disturbance is present in a fault-free surface, which in no way swallows the light like a deep hole, but is distinguished essentially by a different surface roughness or else surface geometry (curvature) from the fault-free surrounding surface.

Instead of bright-field illumination, dark-field illumination can of course be set. In the exemplary embodiment, bright-field illumination has essentially been represented. Dark-field illumination is set corresponding to its definition in such a way that the illumination beams, which are incident on the areas UM surrounding the marking elements ME, are not incident on the receiver optics EO and hence on the receiving sensor ES.

In FIG. 4, on the wafer W, a structured area, the marking area MF, is shown schematically. It contains the marking elements ME and the interposed or surrounding areas UM, which essentially have the condition of the remaining wafer surface.

Figure 7:
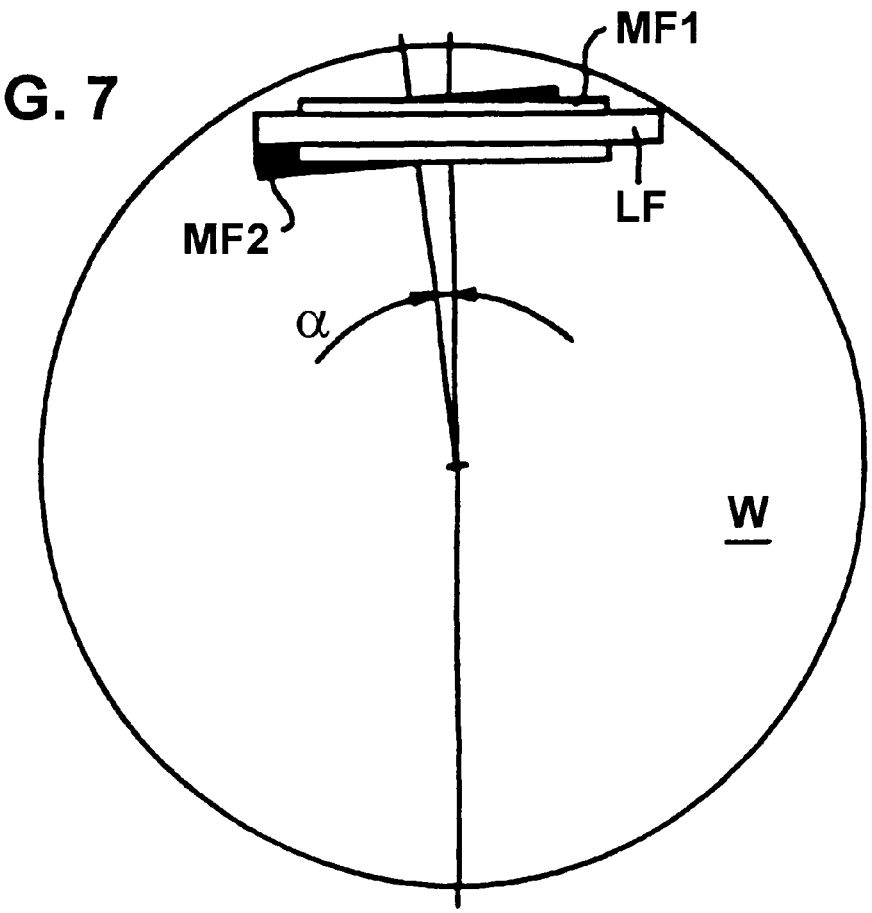
FIG. 7 relates to the treatment of rotated or tilted wafers.
Figure 8:
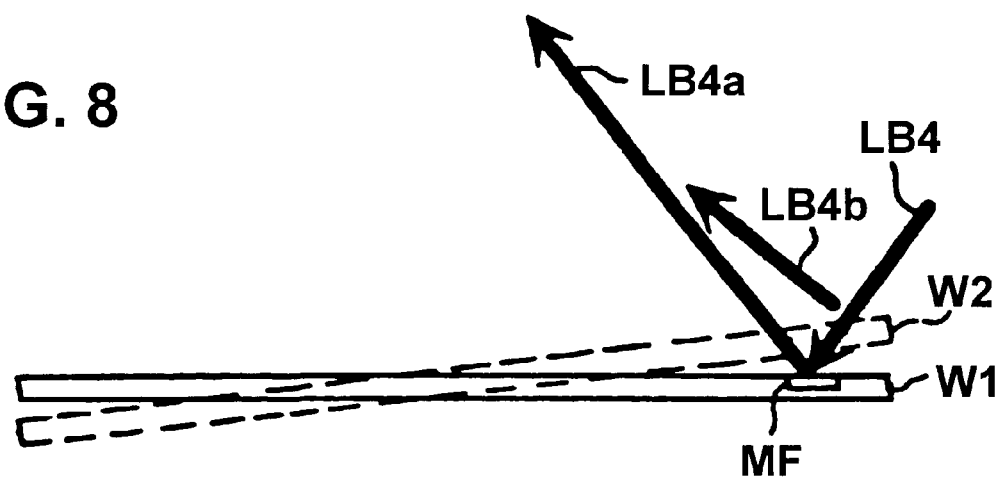
FIG. 8 depicts the reflection of an incident bundle of light on the FIG. 7 wafer.

FIGS. 7 and 8 illustrate how a rotation or tilting of a wafer W can have an effect. FIG. 7 shows a rotation of the wafer W by the angle a. The reading field LF acquires, in the condition represented, in any case, a positionally correctly aligned marking area MF1 and, corresponding to FIG. 7, a rotated marking area MF2 as well. It is thus ensured that slight rotations do not lead to faulty measurements or increase the recognition reliability. On a wafer W1 having a marking area MF, shown in the correct position in FIG. 8, an incident bundle of light LB4 is reflected, corresponding to the reflection law, as reflected bundle of light LB4a. In the case of a tilting corresponding to the wafer W2 shown, a reflected bundle of light LB4b is generated. The length of the arrows, which represent the bundles of light in FIG. 8, is purely schematic. The slight tilting of a wafer shown in FIG. 8 likewise does not lead to a faulty measurement in a reading process corresponding to the invention.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for imaging a stationary marked area, the stationary marked area illuminated by means of an illumination device, receiving optics imaging a specularly reflecting area having the marked area completely in a longitudinal direction thereof, here lying in an x-direction, and at least partially with reference to a height of the marking elements, which run in a y-direction, onto a one- or two-dimensionally spatially resolving receiver, comprising the steps of:

providing bundles of light from the illumination device that are incident on the specularly reflecting area having the marked area in such a way that reflected bundles of light therefore generate, via the receiving optics, associated with the receiving optics, a maximum illumination intensity on a receiving sensor, and thus bright-field illumination with respect to specularly reflecting areas surrounding the marking elements;

orienting a line of light generated by the illumination device such that bundles of light which proceed from a beginning to an end of the line of light, seen in a longitudinal direction of the line of light, are incident on the elements from a beginning to an end of the area having the marked area and thus the bundles of light reflected from the specularly reflecting areas surrounding the marking elements are incident on the receiving sensor via the receiver optics under bright-field conditions;

moving the line of light at the illumination device, to thereby vary an illumination angle of the light relative to the marked area, transversely to its longitudinal extent, until the bundles of light, which are incident on the marked area given a tilting of the surface with the marked area out of normal position, are reflected such that the bundles of light enter into the receiving sensor via the receiving optics under conditions of bright-field illumination;

optimizing contrast on the marked area; and adjusting a height of the line of light such that light components of light scattered by the image, which have an origin in edge regions of the line of light and enter into the receiving optics, are minimized.

2. A method for imaging a marked area the stationary marked area being illuminated by means of an illumination device, receiving optics imaging a specularly reflecting area having the marked area completely in a longitudinal direction thereof, here lying in an x-direction, and at least partially with reference to a height of the marking elements, which run in y-direction, onto a one- or two-dimensionally spatially resolving receiver, comprising the steps of:

providing bundles of light from the illumination device that are incident on the specularly reflecting area having the marked area in such a way that reflected bundles of light therefrom generate, via the receiving optics, a maximum illumination intensity on a receiving sensor, and thus dark-field illumination with respect to the specularly reflecting areas surrounding the marking elements;

orienting a line of light generated by the illumination device such that bundles of light which proceed from a beginning to an end of the line of light, seen in a longitudinal direction of the line of light, are incident on the elements from a beginning to an end of the area having the marked area under dark-field illumination, the bundles of light reflected from the specularly reflecting areas surrounding the marking elements do not get into the receiving sensor under dark-field conditions;

moving the line of light at the illumination device, to thereby vary an illumination angle of the light relative to the marked area, transversely to its longitudinal extent until the bundles of light, which are incident on the marked area given a tilting of the surface with the marked area out of normal position, are reflected such that the bundles of light enter into the receiving sensor via the receiving optics under conditions of dark-field illumination;

optimizing contrast on the marked area; and adjusting a height of the line of light such that light components of light scattered by the image, which have an origin in the edge regions of the line of light and into the receiving optics, are minimized.

3. The method as claimed in claim 1, wherein the generation of a movable line of light is carried out by using a slit diaphragm which is connected downstream of a light source, light incident on the slit diaphragm being homogenized.

4. The method as claimed in claim 1, wherein the generation of a movable line of light is carried out by using a plurality of light guides lying on top of one another, each of which is individually charged with light and whose light exit face on an end thereof represents a plurality of lines of light on top of one another, each of which emits homogeneous light.

5. The method as claimed in claim 1, wherein the receiving optics image the length and height, respectively, of the image with a different imaging scale, so that the length of the image is imaged completely in the image on the receiving sensor and the height of the image is imaged at least partially in the image on the receiving sensor.

6. The method as claimed in claim 1, wherein illumination intensity incident on the receiver sensor and the setting of position of the movable line of light in the illumination device are controlled to optimize contrast.

7. The method as claimed in claim 2, wherein the generation of a movable line of light is carried out by using a slit diaphragm which is connected downstream of a light source, light incident on the slit diaphragm being homogenized.

8. The method as claimed in claim 2, wherein the generation of a movable line of light is carried out by using a plurality of light guides lying on top of one another, each of which is individually charged with light and whose light exit face on an end thereof represents a plurality of lines of light on top of one another, each of which emits homogeneous light.

9. The method as claimed in claim 2, wherein the receiving optics image the length and height, respectively, of the bar code with a different imaging scale, so that the length of the bar code is imaged completely in the image on the receiving sensor and the height of the bar code is imaged at least partially in the image on the receiving sensor.

10. The method as claimed in claim 2, wherein illumination intensity incident on the receiver sensor is controlled to optimize contrast, a control adjusting the setting of position of the movable line of light and intensity of the light in the illumination device accordingly.

11. The method as claimed in claim 1, wherein the image is a bar code.

12. The method as claimed in claim 2, wherein the image is a bar code.

13. A method for imaging a stationary marked area, the stationary marked area illuminated by means of an illumination device, receiving optics imaging a specularly reflecting area having the marked area completely in a longitudinal direction thereof, here lying in an x-direction, and at least partially with reference to a height of the marking elements, which run in a y-direction, onto a one- or two-dimensionally spatially resolving receiver, comprising the steps of:

providing bundles of light from the illumination device that are incident on the specularly reflecting area having the marked area in such a way that reflected bundles of light therefore generate, via the receiving optics, associated with the receiving optics, a maximum illumination intensity on a receiving sensor, and thus bright-field illumination with respect to specularly reflecting areas surrounding the marking elements;

orienting a line of light generated by the illumination device such that bundles of light which proceed from a beginning to an end of the line of light, seen in a longitudinal direction of the line of light, are incident on the elements from a beginning to an end of the area having the marked area and thus the bundles of light reflected from the specularly reflecting areas surrounding the marking elements are incident on the receiving sensor via the receiver optics under bright-field conditions;

moving the line of light at the illumination device, to thereby vary an illumination angle of the light relative to the marked area, transversely to its longitudinal extent, until the bundles of light, which are incident on the marked area given a tilting of the surface with the marked area out of normal position, are reflected such that the bundles of light enter into the receiving sensor via the receiving optics under conditions of bright-field illumination;

optimizing contrast on the marked area by automatically checking for a predetermined level of contrast and changing the illumination angle until the predetermined level of contrast is obtained; and adjusting a height of the line of light such that light components of light scattered by the image, which have an origin in edge regions of the line of light and enter into the receiving optics, are minimized.

14. A method for imaging a marked area the stationary marked area being illuminated by means of an illumination device, receiving optics imaging a specularly reflecting area having the marked area completely in a longitudinal direction thereof, here lying in an x-direction, and at least partially with reference to a height of the marking elements, which run in y-direction, onto a one- or two-dimensionally spatially resolving receiver, comprising the steps of:

providing bundles of light from the illumination device that are incident on the specularly reflecting area having the marked area in such a way that reflected bundles of light therefrom generate, via the receiving optics, a maximum illumination intensity on a receiving sensor, and thus dark-field illumination with respect to the specularly reflecting areas surrounding the marking elements;

orienting a line of light generated by the illumination device such that bundles of light which proceed from a beginning to an end of the line of light, seen in a longitudinal direction of the line of light, are incident on the elements from a beginning to an end of the area having the marked area under dark-field illumination, the bundles of light reflected from the specularly reflecting areas surrounding the marking elements do not get into the receiving sensor under dark-field conditions;

moving the line of light at the illumination device, to thereby vary an illumination angle of the light relative to the marked area, transversely to its longitudinal extent until the bundles of light, which are incident on the marked area given a tilting of the surface with the marked area out of normal position, are reflected such that the bundles of light enter into the receiving sensor via the receiving optics under conditions of dark-field illumination;

optimizing contrast on the marked area by automatically check for a predetermined level of contrast and changing the illumination angle until the predetermined level of contrast is obtained; and adjusting a height of the line of light such that light components of light scattered by the image, which have an origin in the edge regions of the line of light and into the receiving optics, are minimized.

* * * * *